United States Patent
Son

[11] Patent Number: 5,821,886
[45] Date of Patent: Oct. 13, 1998

[54] VARIABLE LENGTH CODE DETECTION IN A SIGNAL PROCESSING SYSTEM

[75] Inventor: Jae Cheol Son, Cupertino, Calif.

[73] Assignee: Samsung Electronics Company, Ltd., Seoul, Rep. of Korea

[21] Appl. No.: 731,339

[22] Filed: Oct. 18, 1996

[51] Int. Cl.[6] .............................. H03M 7/40; H04N 7/12
[52] U.S. Cl. ............................................ 341/67; 348/423
[58] Field of Search ................................ 341/67, 65, 63, 341/106, 60, 51; 348/390, 423

[56] References Cited

U.S. PATENT DOCUMENTS

3,701,108  10/1972  Loh et al. ................................. 341/67

*Primary Examiner*—Jeffrey A. Gaffin
*Assistant Examiner*—Peguy JeanPierre
*Attorney, Agent, or Firm*—Skjerven, Morrill, MacPherson, Franklin & Friel, L.L.P.; Kent B. Chambers

[57] ABSTRACT

A group of incoming data stream bits having packed variable length code ("VLC") words is applied to an entropy code bit length searching module. The group of bits is replicated within a plurality of matching modules selectively distributed among entropy code bit length searching logic units. Each unit of entropy code bit length searching logic supports a VLC word table as characterized by, for example, standard compression formats such as MPEG-1, MPEG-2, H.261, and H.263. The matching modules are divided into groups within the entropy code bit length searching logic units. A group of matching modules is allocated to each VLC bit length represented in the associated VLC word supported table. A number of matching modules are allocated to each bit length equal to a minimum number of patterns unique to VLC words of a particular bit length. The matching modules compare an incoming data group to respective patterns. A detected match is indicated by an appropriately set group output signal. Each entropy code bit length searching logic unit includes a bit length encoder that receives the group output signals. The set group output signal indicates the bit length of a current VLC, and the bit length encoder encodes this information into a bit length code output signal. The bit length code signal is utilized by a shifter to parse a corresponding bit length of current data. The parsed current data may be directly applied to an address generator which generates an output signal for a decoding look up table.

26 Claims, 5 Drawing Sheets

VARIABLE LENGTH CODE DETECTION IN A SIGNAL PROCESSING SYSTEM

BACKGROUND OF THE INVENTION

1. Field of the Invention

This invention relates to signal processing and more particularly relates to detecting individual variable length code words included in a data stream.

2. Description of the Related Art

Data transmission involving voluminous quantities of information has become a frequent occurrence with the advent of large bandwidth transmission capabilities and implementation of high speed processing applications and equipment. One of the driving forces behind large scale data transmission is the increasing use of multimedia operations. Although the computing power of processors has advanced steadily and rapidly, the demand for higher processing power and computing efficiency remains unabated due to the development of aggressive new applications in the multimedia field that call for the display and performance of ever larger data quantities. To reconcile the information quantities involved with transmitting, receiving, and processing limitations, various compression standards have attained wide spread use for compressing and decompressing information. Widely accepted and used compression and decompression standards for video data are the International Organization for Standardization/International Electrotechnical Commission (ISO/IEC) Motion Pictures Experts Group (MPEG) MPEG-1 and MPEG-2 standards, and the United Nation's International Telecommunications Union Telecommunications Standardization Bureau (ITU-T) H.261 and H.263 standards.

The MPEG-1, MPEG-2, H.261, and H.263 standards extensively utilize variable length code ("VLC") words to assist in achieving reasonable compression ratios. The VLC words are generally characterized in tables commonly referred to as Huffman tables or entropy code tables.

The VLC words are generally packed into a bit stream for transmission. To decode an incoming bit stream, the VLC words are individually decoded. Conventionally, to accurately decode a current VLC, large look up tables are used to determine the bit length of the current VLC word. These look up tables occupy a relatively large amount of valuable chip real estate.

SUMMARY OF THE INVENTION

In one embodiment of the present invention, an apparatus to detect a current entropy code word in a group of bits, and the current entropy code word having a bit length, wherein a predetermined number of possible bit lengths of the current entropy code word is t+1, includes a plurality of matching modules, wherein the matching modules each receive the group of bits and each attempts to determine the bit length of the current entropy code word in the group of bits, and one of the matching modules determines the bit length of the current entropy code word in the group of bits and provides a unique output signal with respect to output signals of the remaining matching modules. The apparatus further includes t+1 matching module groups wherein each of the t+1 matching module groups includes a predetermined number of matching modules, and each of the t+1 matching module groups represents one of the t+1 predetermined number of possible bit lengths of the current entropy code word, wherein each of the t+1 matching module groups has an output signal, and the one of the t+1 matching module groups having the matching module having the unique output signal has a unique output signal, with respect to output signals of the remaining t+1 matching module groups, that indicates the bit length of the current entropy code word.

In another embodiment of the present invention a method of detecting a current entropy code word in a group of bits, and the current entropy code word having a bit length, wherein a predetermined number of possible bit lengths of the current entropy code word is t+1, includes the steps of concurrently comparing a plurality of bit patterns to a respective segment of the group of bits, wherein each bit pattern is associated with only one of the possible t+1 bit lengths of the current entropy code and determining which bit pattern of the plurality of bit patterns matches the respective segment of the group of bits. The method further includes the step of providing an output signal, responsive to the bit pattern determined to match the respective segment of the group of bits, that identifies the bit length of the current entropy code.

BRIEF DESCRIPTION OF THE DRAWINGS

Features appearing in multiple figures with the same reference numeral are the same unless otherwise indicated.

DETAILED DESCRIPTION OF THE PREFERRED EMBODIMENTS

The following description of the invention is intended to be illustrative only and not limiting.

The immediately following material provides a general overview of multimedia multiprocessor system 100 which in one embodiment includes multimedia signal processor 200 which is any of the Samsung Semiconductor, Inc.'s MSP family of multimedia signal processors. For additional detail, please refer to co-pending U.S. patent applications Ser. No. 08/697,102 of L. Nguyen, entitled "Microprocessor Operation in a Multimedia Signal Processor", Ser. No. 08/699,597 of L. Nguyen, entitled "Single-Instruction-Multiple-Data Processing in a Multimedia Signal Processor", Ser. No. 08/697,086 of L. Nguyen et al., entitled "Single-Instruction-Multiple-Data Processing Using Multiple Banks of Vector Registers", and Ser. No. 08/699,585 of M. Mohamed et al., entitled "Single-Instruction-Multiple-Data Processing With Combined Scalar/Vector Operations" all of which are incorporated herein by reference in their entirety.

Figure 1:
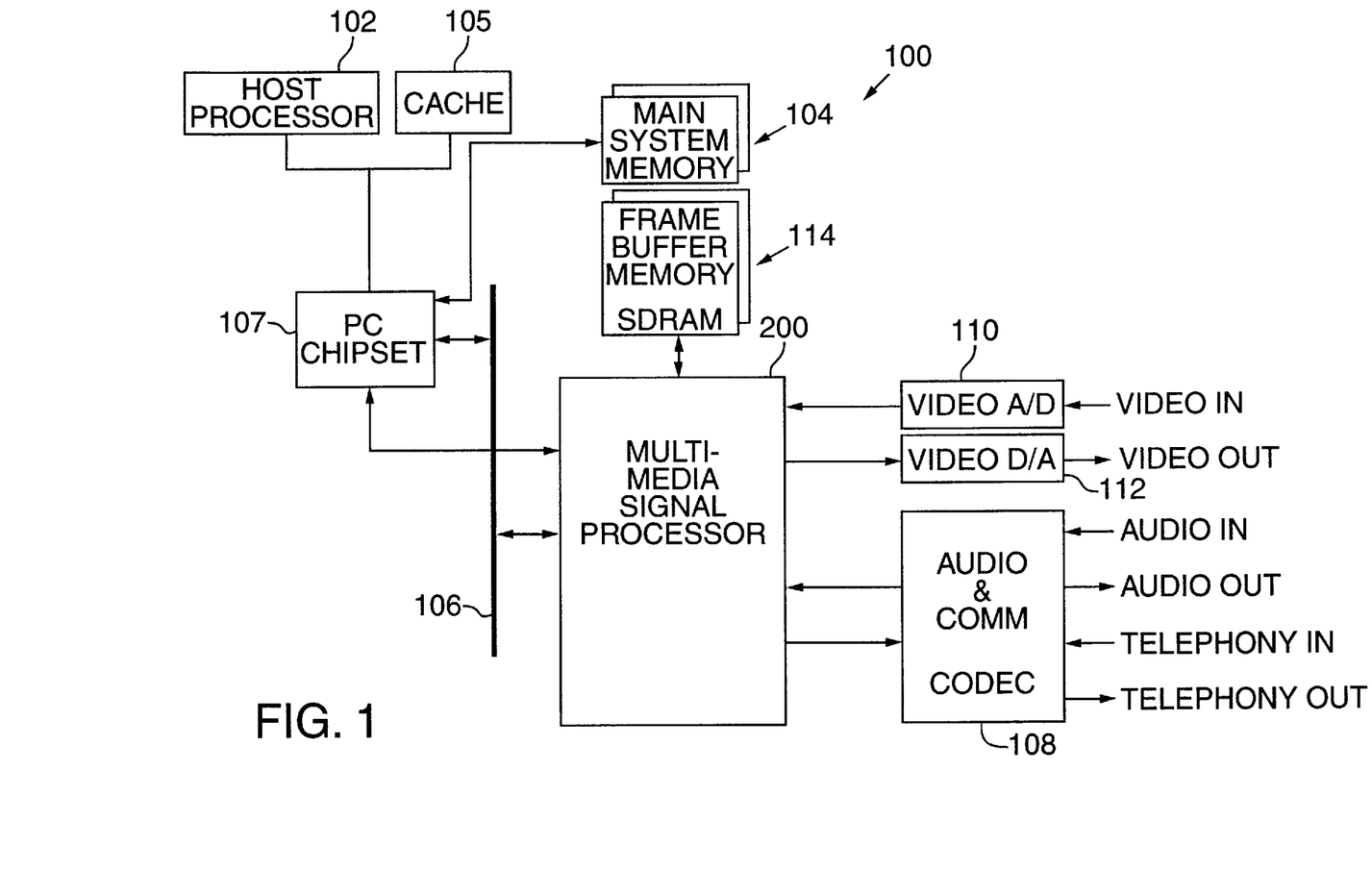
FIG. 1 is a high-level schematic block diagram illustrating a multimedia multiprocessor system in accordance with an embodiment of the present invention.

Referring to FIG. 1, a high-level schematic block diagram illustrates a multimedia multiprocessor system 100 including a host processor 102 and a multimedia signal processor 200. A typical host processor 102 is an x86 processor such as an Intel Corporation Pentium™ or Pentium Pro™ processor. The host processor 102 executes programs based on instructions and data held primarily in a system memory 104 and cache 105. The host processor 102 communicates with the multimedia signal processor 200 via a PC chipset 107 and a system bus 106, such as a PCI bus. The multimedia signal processor 200 interfaces to various functional blocks such as an audio and communication CODEC 108 for receiving audio and telephony communication, a video A/D converter 110 for receiving video input signals, a video D/A converter 112 for transmitting video output signals, and a frame buffer SDRAM memory 114.

Figure 2:
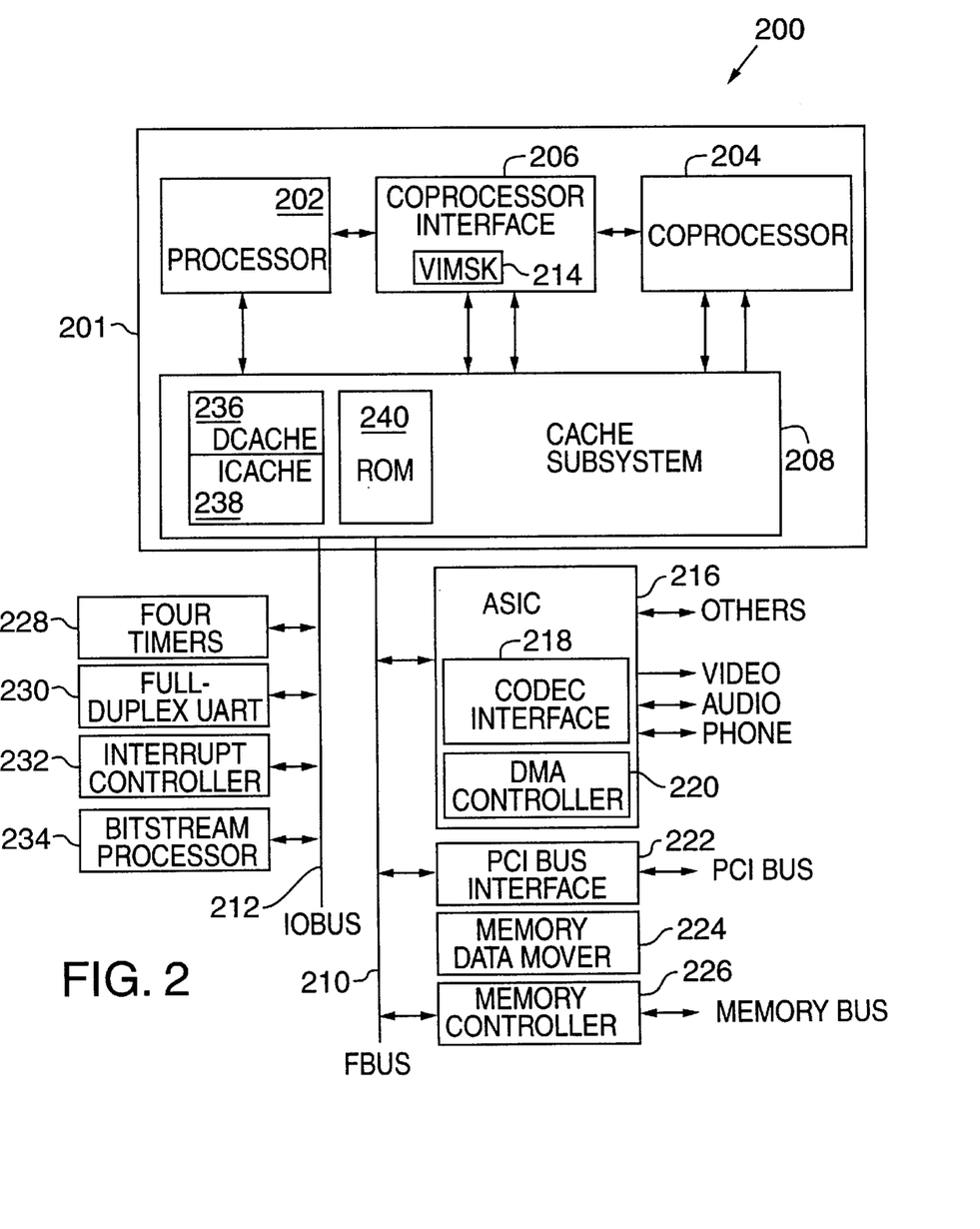
FIG. 2 is a schematic block diagram showing a multimedia signal processor multimedia multiprocessor system illustrated in FIG. 1.

Referring to FIG. 2, a schematic block diagram shows the multimedia signal processor 200 of the multimedia multiprocessor system 100 (FIG. 1). The multimedia signal processor 200 includes a digital signal processor ("DSP") core 201 which interfaces via a fast bus (FBUS) 210 to a plurality of FBUS peripherals including, for example, a 32-bit PCI bus interface 222, a 64-bit SDRAM memory controller 226, an 8-channel DMA controller 220, an ASIC logic block 216, and a memory data mover 224 for moving data between the host processor 102 and frame buffer SDRAM memory 114. The PCI bus interface 222 interfaces to the system bus 106 and operates, for example, at 33 MHz. The ASIC logic block 216 furnishes control logic for implementing custom functionality, as desired. The ASIC logic block 216, in one embodiment, supplies 10 Kgates including interfaces to various analog CODECs and customer-specific I/O devices. The memory data mover 224 transfers DMA data from the host processor 102 to SDRAM memory 114 which is local to the multimedia signal processor 200. The DSP core 201 also interfaces via an I/O bus to a plurality of I/O bus devices including, for example, an 8254-compatible programmable interval timer 228, a 16450-compatible UART serial line 230, an 8259-compatible programmable interrupt controller 232, and a bitstream processor 234 for processing a video bit stream. For more information regarding the bitstream processor 234, please refer to co-pending U.S. patent application Ser. No. 08/699,303 of C. Reader, entitled "Methods and Apparatus for Processing Video Data", which is incorporated herein by reference in its entirety. In particular, please refer to the Description of the Preferred Embodiments and Appendices A, chapter ten and B of the U.S. patent application Ser. No. 08/699,303 of C. Reader, entitled "Methods and Apparatus for Processing Video Data."

The DSP core 201 is the computation engine of the multimedia signal processor 200 and includes a processor 202, a co-processor 204, a cache subsystem 208, the fast bus (FBUS) 210, and the I/O bus 212. In one embodiment, the processor 202 is a 32-bit ARM7™ RISC control processor which performs general processing functions such as context switch enable requests, real-time operating system operations, interrupt and exception handling, input/output device management, communication with the host processor 102 and the like. In one embodiment, the processor 202 operates at 40 MHz. The processor 202 interfaces to the co-processor 204 through a co-processor interface 206.

The processor 202 performs the exception handling in response to exceptions, generally conditions that occur during instruction processing, causing a modification of execution control flow. For more information regarding exception handling, please refer to co-pending U.S. Patent applications Ser. No. 08/699,295 of Song et al., entitled "System And Method For Handling Software Interrupts With Argument Passing" and Ser. No. 08/699,294 of Song et al., entitled "System And Method For Handling Interrupt And Exception Events In An Asymmetric Multiprocessor Architecture" which are incorporated herein by reference in their entirety.

The co-processor 204 is the digital signal processing engine of the multimedia signal processor 200. In one embodiment, co-processor 204 is a vector processor of the Samsung MSP family. As a vector processor, the co-processor 204 has a Single-Instruction Multiple-Data architecture and includes a pipelined RISC engine that operates on multiple data elements in parallel to perform signal processing functions such as Discrete Cosine Transforms (DCT), FIR filtering, convolution, video motion estimation and other processing operations. The co-processor 204 supports vector arithmetic in which multiple data elements are operated upon in parallel, in the manner of a vector process, by a plurality of vector execution units. The co-processor 204 executes both scalar operations and combined vector-scalar operations. The multiple data elements of the co-processor 204 are packed in a 576-bit vector which is computed at a rate of thirty-two 8/9-bit fixed-point arithmetic operations, sixteen 16-bit fixed-point arithmetic operations, or eight 32-bit fixed-point or floating point arithmetic operations per cycle (for example, 12.5 ns). Most 32-bit scalar operations are pipelined at a rate of one instruction per cycle while most 576-bit vector operations are pipelined at a rate of one instruction in two cycles. Load and store operations are overlapped with arithmetic operations and are executed independently by separate load and store circuits.

Figure 3:
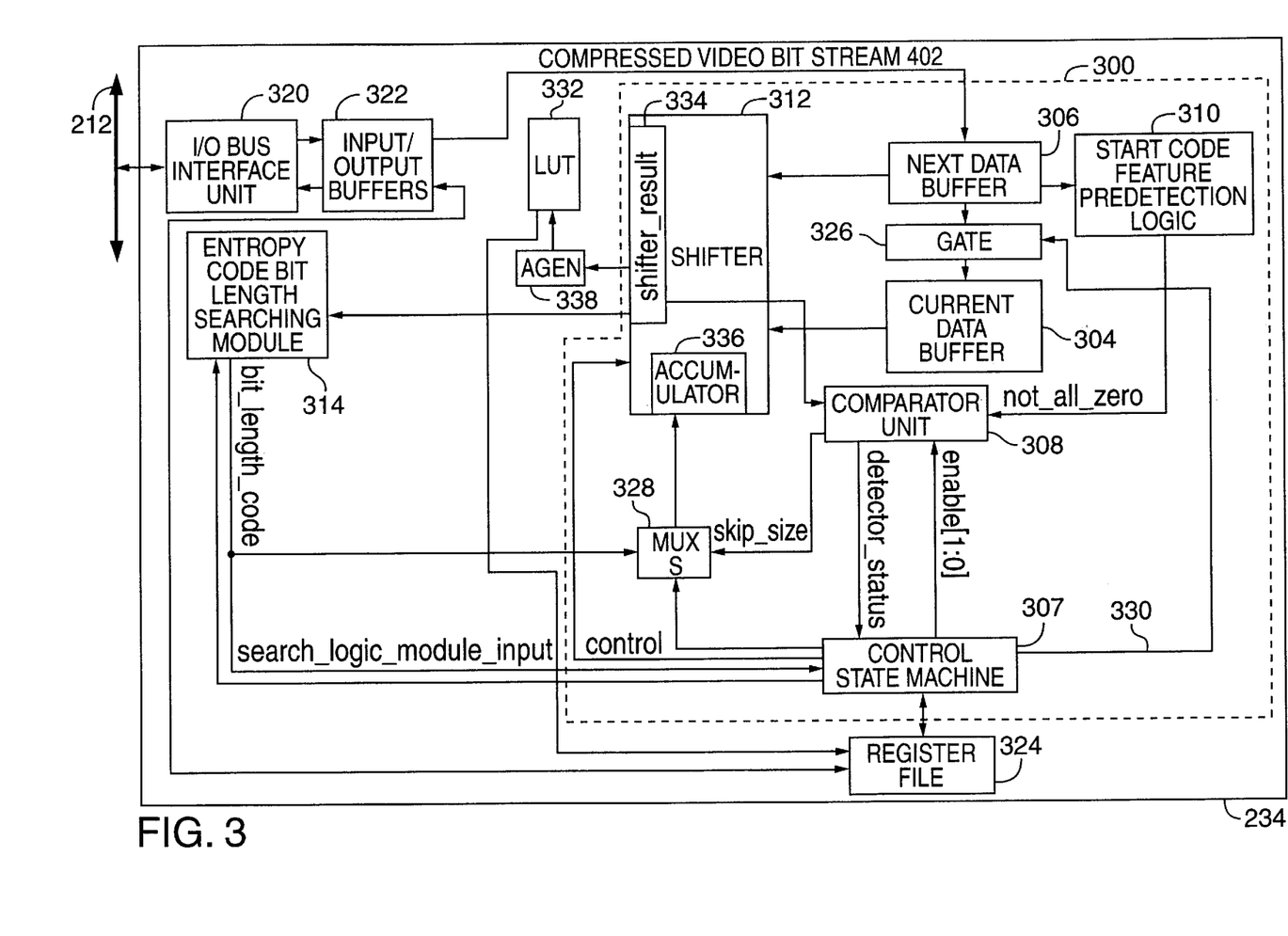
FIG. 3 illustrates a bitstream processor of the multimedia signal processor system of FIG. 1.

Referring to FIG. 3, the bitstream processor 234 is one of the multimedia multiprocessor system 100 internal peripherals. The bitstream processor 234 is a specialized hardware logic block that supports various bit stream video data compression and decompression. The bitstream processor 234 is especially designed for bit-level processing. The bitstream processor 234 works as an independent processing unit and is under software control by either processor 202 or co-processor 204. More specifically, the bitstream processor 234 encodes and decodes all information contained in a slice or group of blocks ("GOB") layer and below and receives information from and transmits information to the DSP core 201 through the I/O bus 212. When decoding information, the information is generally received as a bit stream, such as compressed video bit stream 402, and may include start codes, header parameters, and compressed data according to the corresponding standard. This compressed video bit stream 402 is packed but does not need to be byte aligned in some applications; i.e., a bit in a bit stream is byte aligned if its position is a multiple of 8-bits from a first bit in the bit stream. Note that the compressed video bit stream 402 can include data for several slices or GOBs.

In a multimedia environment, video sequences are processed and displayed on, for example, personal computers and video conferencing equipment. The video sequences are generally in the form of a compressed bit stream encoded using any of a plurality of video standards such as the International Organization for Standardization/International Electrotechnical Commission (ISO/IEC) Motion Pictures Experts Group (MPEG) MPEG-1 and MPEG-2 standards, and the United Nation's International Telecommunications Union Telecommunications Standardization Bureau (ITU-T) H.261 and H.263 standards. MPEG-1, MPEG-2, H.261, and H.263 are respectively described in the International Standard of the International Organization for Standardization and the International Electrotechnical Commission (ISO/IEC) 11172-2 (1992) (MPEG-1), the ISO/IEC Joint Technical Committee (JTC) 1/SC 29 N 0981 Rev (Mar. 31, 1995) (MPEG-2), the United Nation's International Telecommunications Union—Telecommunications Standardization Bureau (ITU-T) H.261 recommendation, and the ITU-T H.263 recommendation, all of which are incorporated by reference in their entirety. MPEG-1, MPEG-2, H.261, and H.263 are herein collectively referred to as the "multi-standard formats"; however, it will be understood that the multimedia multiprocessor system 100 may be adapted to process bit streams formatted in accordance with other standards.

Figure 4:
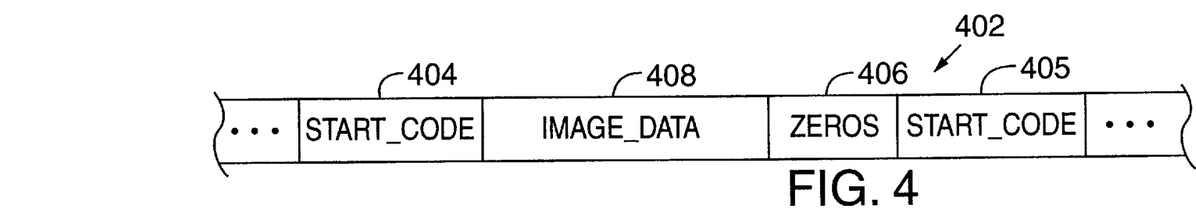
FIG. 4 is a generically representative bit stream compressed in accordance with compression standards.

Referring to FIG. 4, compressed video bit stream 402 generally represents a bit stream compressed in accordance with the multi-standards compression formats. Start codes 404 and 405 are reserved bit patterns that do not otherwise occur in compressed video bit stream 402. Start codes 404 and 405 mark the beginning of formatted information that includes image data 408 and syntax information that, for example, identifies the currently employed compression standard. Video bit streams in accordance with the multiple video standards are of variable length and may or may not be byte aligned, i.e. the number of bits between start codes may or may not be an even multiple of 8. Additionally, a number of zero stuffing bits 406 are generally inserted between image data 408 and the next start code 405. A number of zero stuffing bits 406 are inserted so that for MPEG-1 and MPEG-2 applications, compressed video bit stream 402 up to a slice layer is byte-aligned. For H.263 applications, compressed video bit stream 402 up to a GOB layer may be byte-aligned, and compressed video bit stream 402 up to a picture layer is byte-aligned. H.261 applications are not byte aligned.

The zero stuffing bits 406 and any image data 405 having an error, i.e. corrupted image data, do not contribute useful information to multimedia multiprocessor system 100. Therefore, discarding zero stuffing bits 406 and corrupted image data 408 as quickly as possible and detecting the next start code improves the overall compressed video bit stream 402 processing performance of multimedia multiprocessor system 100. When compressed video bit stream 402 is of variable length between start codes 404 and 405, as with the multi-standard formats, the location of next start code 405 is not predetermined, and, therefore, compressed video bit stream 402 is examined to detect next start code 405.

Referring to FIG. 3, bitstream processor 234 includes multi-standard start code detector system 300 to search for and detect multi-standard start codes in compressed video bit stream 402. In a, for example, multimedia personal computer ("PC") environment, the compressed video bit stream 402 will be fed from, for example, a compact disk ROM driver, a hard disk drive, and a network interface (not shown). The compressed video bit stream 402 source could be either the ASIC 216 or the PCI bus interface 222. Data stored in a 32-byte buffer of the ASIC 216 or PCI bus interface 222 will be transferred to the frame buffer SDRAM memory 114 (FIG. 1) using DMA. DSP core 201 examines syntax information in compressed video bit stream 402. From the syntax information DSP core 201 determines the format of compressed video bit stream 402 prior to enabling bitstream processor 234 to begin processing compressed video bit stream 402. Processor 202 writes to a BP_MODE register in register file 324 to indicate the format of compressed video bit stream 402 which in this embodiment may be any of the multi-standard formats. The format of the BP_MODE register is given in Table 1.

TABLE 1

| Byte/Bit | 7 | 6 | 5 | 4 | 3 | 2 | 1 | 0 |
|---|---|---|---|---|---|---|---|---|
| Byte 0 | PS | | PT | | — | | SF | |
| Byte 1 | | | | PARAM_SET0 | | | | |
| Byte 2 | | | | PARAM_SET1 | | | | |
| Byte 3 | | | | PARAM_SET2 | | | | |

Bits 2:0 of the BP_MODE register byte 0 indicate the "SF" or standard format of compressed video bit stream 402. During an operation to detect next start code 405, control state machine 307 uses this standard format information to accurately control multi-standard start code detector system 300. Table 2 characterizes SF.

TABLE 2

| Byte0[2:0] | Standard Format (SF) |
|---|---|
| 3'b000 | MPEG-1 Video Encoding |
| 3'b001 | MPEG-1 Video Decoding |
| 3'b010 | MPEG-2 Video Encoding |
| 3'b011 | MPEG-2 Video Decoding |
| 3'b100 | H.261 Encoding |
| 3'b101 | H.261 Decoding |
| 3'b110 | H.263 Encoding |
| 3'b111 | H.263 Decoding |

When bitstream processor 234 is enabled by DSP core 201, compressed video bit stream 402 is input via I/O bus 212, I/O bus interface unit 320, and I/O buffers 322 into next data buffer 306, which in this embodiment is a 16 bit flip-flop implemented FIFO buffer. Information may be bidirectionally transferred between I/O bus 212, I/O bus interface unit 320, and I/O buffers 322. During the initial reception of compressed video bit stream 402, control state machine 307 opens gate 326, and the 16 bits of data in next data buffer 306 are transferred to current data buffer 304, which in this embodiment is also a 16 bit flip-flop implemented FIFO buffer. The contents of current data buffer 304 are shifted by shifter 312 into a sixteen bit register, shifter_result 334. The next 16 bits of compressed video bit stream 402 are stored in next data buffer 306. Processed compressed video bit stream 402 is subsequently transferred from bitstream processor 234 to DSP core 201 via I/O bus 212. When DSP core 201 detects the end of image data 408, DSP core 201 instructs bitstream processor 234 to find next start code 405.

To request bitstream processor 234 to find next start code 405, either processor 202 or co-processor 204 places bitstream processor 234 in an idle state, if it is not already in an idle state, requests bitstream processor 234 to detect next start code 405, and enables bitstream processor 234 to begin processing. To place bitstream processor 234 in the idle state, either processor 202 or co-processor 204 sends a software reset command to the bitstream processor 234, if the bitstream processor 234 is not idle, by writing a "1" to a SOFT_RESET bit of the BP_CONTROL register located in register file 324. Either processor 202 or co-processor 204 may request bitstream processor 234 to detect next start code 405 by writing a "1" to a DETECT_START_CODE bit of the BP_CONTROL register. After resetting bitstream processor 234 and requesting detection of next start code 405, either processor 202 or co-processor 204 enables bitstream processor 234 to start processing by writing a "1" to a BP_EN bit of the BP_CONTROL register. The format of the BP_CONTROL register is given in Table 3.

TABLE 3

| Bit Position | Flag Name | Read/Write | Description |
| --- | --- | --- | --- |
| 0 | BP_EN | R/W | BP processing enable |
| 1 | SOFT_RESET | R | BP software reset |
| 2 | PAUSE | R | BP processing freeze |
| 3 | DETECT_START_CODE | R | Detect the next start code |
| 4 | STEP | R | BP step mode processing |
| 5 | CTX_SWITCH | R | Context switching request |
| 6 | CTX_MODE | R | Context switching mode |
| 7 | CTX_RELOAD | R | Context reload request |
| 8 | ERR_HANDLE_MODE | R | Error handle mode |
| 9 | — | — | reserved |
| 10–15 | — | — | reserved |
| 16:31 | NO_MBS[0]:NO_MBS[15] | R | Number of macroblocks to be encoded in the current slice or Group of Blocks |

MULTI-STANDARD START CODE DETECTOR SYSTEM 300

The multi-standard start code detector system 300 of bitstream processor 234 begins searching for a next start code of compressed video bit stream 402 after either the end of image data 408 is detected or any corrupted image data 408 is detected by DSP core 201 or bitstream processor 234. Upon beginning a next start code 405 detection operation to detect next start code 405, multi-standard start code detector system 300 rapidly discards entire bit groups until detection of at least a portion of next start code 405. This operation may be conducted on all of the byte aligned and non-byte aligned bitstream formats. Next start code detection operations involving non-byte aligned formats may involve a limited bit by bit discard. By discarding groups of bits rather than bit by bit, detection time of start codes decreases and more processing time can be devoted to processing useful information.

During a start code search operation and assuming that no corrupted data is detected in image data 408 and that bitstream processor 234 is enabled and requested to detect next start code 405, control state machine 307 appropriately sets signals enable[1:0] to begin a start code detection operation. The signals enable[1:0] are used by control state machine 307 and comparator unit 308 to select a bit pattern, uniquely associated with the next start code 405. Sixteen bit comparator unit 308 compares this bit pattern against the contents of register shifter_result 334. Comparator 308 may be implemented using any of a variety of well-known circuits or software algorithms such as with exclusive OR logic or exclusive OR algorithms. When compressed video bit stream 402 is formatted in accordance with one of the multi-standard formats, the most significant bits of the next start code 405 include 0001h (the "h" suffix indicates hexadecimal representation). Setting signals enable[1:0] equal to 10b requests comparator unit 308 to match the contents of current data buffer 304 with 0001h. (The "b" suffix of "10b" indicates binary number representation.)

Concurrently with the comparison operation by comparator unit 308, next data, stored in next data buffer 306, is processed using start code feature logic 310. Because zero stuffing bits 406 may be variable in length, the exact bit positions occupied by next start code 405 in next data buffer 306 are not predictable. Because zero stuffing bits 406 are of variable length, shifter 312 shifts out an initial number of zero stuffing bits 406 equal to eight minus the three least significant bits of accumulator 336, Acc[2:0]. As described below, the five bit accumulator 336 keeps track of the bit length of parsed image data 408 entropy code words. If image data 408 is not byte aligned, the difference between being byte aligned and non-byte aligned equals eight minus Acc[2:0].

In order to minimize the number of patterns used by comparator unit 308 to detect next start code 405 while generally discarding entire bit groups from register shifter_result 334, a feature of next start code 405 is "predetected" in next data buffer 306 with a low overhead processing operation. Once a predetermined feature of next start code 405 is predetected, current data shifting sizes are modified to ensure that the predetermined feature of next start code 405 will match a bit pattern used by next data buffer 306. The predetection operation could be eliminated by increasing the number of bit patterns involved in the next data buffer 306 comparison operation described below.

Assuming that during a start code detection operation the end of image data 408 was reached prior to beginning the next start code 405 detection operation, only zero stuffing bits 406 will be present in next data buffer 306 prior to receiving next start code 405. The low overhead start code feature predetection operation is implemented by start code logic 310. Start code feature logic 310 performs a logical OR operation on the contents of next data buffer 306 to detect a "1". If a "1" is detected, start code feature predetection logic 310 output signal, not_all_zero, is set to "1" and applied to an input node of comparator unit 308. Otherwise, the not_all_zero output signal is set to "0".

While processing compressed video bit stream 402, if the comparator unit 308 does not detect next start code 405 in the contents of register shifter_result 334 by matching the contents of next start code 405 with 0001h and the not_all_zero signal is "0", comparator unit 308 sets five bit output signal skip_size equal to the bit capacity of current data buffer 304 which is 16 bits in this embodiment. During this next start code 405 detection operation, control state machine 307 selects comparator unit 308 output signal skip_size for transfer through multiplexer 328 to shifter 312. Shifter 312 shifts out the 16 bit contents of register shifter_result 334, and control state machine 307 opens gate 326 using a control signal conducted by gate control line 330. The entire 16 bit contents of next data buffer 306 are loaded into current data buffer 304, and the next 16 bits of compressed video bit stream 402 are loaded into next data buffer 306. Again, the contents of current data buffer 304 are loaded into register shifter_result 334. This process is repeated until the not_all_zero signal is set by start code feature predetection logic 310.

At some point during the search for the next start code 405, at least a portion of the next start code 405 will be loaded into the next data buffer 306. Start code feature predetection logic 310 will thus detect the "1" included in the most significant bits of next start code 405 and set output signal not_all_zero to "1". Assuming the compressed video bit stream 402 is byte aligned, either bit eight or bit zero of the next data in next data buffer 306 is set to "1". As described above, bitstream processor 234 has been notified of the compressed video bit stream 402 format by DSP core 201 via the SF bits of the BP_MODE register, and, in this byte aligned case, the SF bits indicate that compressed video bit stream 402 is byte aligned formatted in accordance with either MPEG-1 or MPEG-2. Comparator unit 308 sets output signal skip_size to eight (1000b) which ensures that comparator unit 308 will not fail to detect next start code 405. The contents of register shifter_result 334, Acc[4:0] are set to 01000b by output signal skip_size. Shifter 312 shifts the most significant eight bits out of register shifter_result 334, and eight bits of next data from next data buffer 306 are loaded into the least significant bit positions of register shifter_result 334.

After each one byte shift, the contents of register shifter_result 334 are incremented by 1000b. Every time Acc[4:0] exceeds fifteen, control state machine 307 opens gate 326, and the contents of next data buffer 306 are loaded into current data buffer 304. The contents of current data buffer 304 are shifted into register shifter_result 334, and the next sixteen bits of compressed video bit stream 402 are loaded into next data buffer 306. Comparator unit 308 compares the contents of register shifter_result 334 to the bit pattern uniquely associated with the next start code 405 which is 0001h in this embodiment. Within two cycles, comparator unit 308 will match the contents of current data buffer 304 with 0001h. Upon detecting a match, comparator unit 308 sets a second output signal, detector_status, to "1" which indicates that the current data in register shifter_result 334 includes sixteen of the most significant bits of next start code 405. Control state machine 307 notifies DSP core 201 that a start code has been detected and sets output signals enable[1:0] to 00b to place comparator unit 308 in an idle state. Bitstream processor 234 then awaits further information from DSP core 201 or decodes next start code 405 if next start code 405 is a slice start code.

Assuming that start code feature predetection logic 310 has just asserted output signal not_all_zero as "1", if bitstream processor 234 has been notified by DSP core 201 via the SF bits of the BP_MODE register that compressed video bit stream 402 is not byte aligned, in accordance with either H.261 or H.263, the location of the 1h bit of the 0001h portion of next start code 405 within next data buffer 306 is unknown. Comparator unit 308 sets output signal skip_size to one bit. Shifter 312 shifts the contents of register shifter_result 334 successively bit by bit, replacing least significant bits with most significant bits from next data buffer 306. After each one bit shift, comparator unit 308 compares the current data in register shifter_result 334 to a bit pattern uniquely associated with the next start code 405. This process repeats until a match is detected which will occur within at most 16 cycles. When a match is detected, register shifter_result 334 includes at least a portion of the next start code 405, and comparator unit 308 sets output signal detector_status to "1" to notify control state machine 307 that the contents of register shifter_result 334 include the 0001h portion of next start code 405. In response, the bitstream processor 234 resets output signals enable[1:0] to 00b to place comparator unit 308 into an idle state. Control state machine 307 notifies DSP core 201 that a start code has been detected and sets output signals enable[1:0] to 00b to place comparator unit 308 in an idle state. Bitstream processor 234 then awaits further information from DSP core 201 or decodes next start code 405 if next start code 405 is a slice start code.

When bitstream processor 234 detects an error in the image data 408, bitstream processor 234 interrupts processor 202 and checks the content of the err_handle_mode flag of Table 3 in the BP_CONTROL register in register file 324. When the err_handle_mode flag is set to "1", the bitstream processor 234 automatically finds the next start code 405 which expedites recovery from the error. If the err_handle_mode flag is set to "0", bitstream processor 234 enters an idle state to await further information from DSP core 201. Chapter 10, section 13 of Appendix A of the U.S. patent application Ser. No. 08/699,303 of C. Reader, entitled "Methods and Apparatus for Processing Video Data describes in more detail "job hand-shaking" between the bitstream processor 234 and DSP core 201.

If an error in image data 408 is detected and the err_handle_mode flag is set to "1", bitstream processor 234 immediately begins an efficient operation to detect next start code 405. Control state machine 307 sets output signals enable[1:0] to 10b which requests comparator unit 308 to search for a predetermined pattern that is not included in image data 408. In this embodiment, 0000h is not allowed in the image data 408 of the compressed video bit stream 402 formatted in accordance with the multi-standard formats. Comparator unit 308 begins comparing the sixteen bit content of register shifter result 334 with 0000h. If a match is not detected, output signal detector_status remains "0". Comparator unit 308 sets output signal skip_size to 10000h, and control state machine 307 selects the skip_size signal input to multiplexer 328 for transfer to shifter 312. Control state machine 307 enables gate 326 via a control signal on gate control line 330 to transfer the next sixteen bits stored in next data buffer 306 to current data buffer 304. Sixteen bits from compressed video bit stream 402 are loaded into next data buffer 306 and the contents of current data buffer 304 are loaded into register shifter_result 334. Again, comparator unit 308 compares the contents of register shifter_result 334 with 0000h. The operation continues until a match is detected by comparator unit 308, and comparator unit 308 notifies control state machine 307 of the match detection by setting output signal detector_status equal to "1". At this point in the operation, multi-standard start code detector system 300 has detected the zero stuffing bits 406.

To complete the error handling start code detection operation following detecting an error in image data 408, control state machine 307 sets output signals enable[1:0] to 01b. The start code detection process may continue as described above assuming a non-byte aligned compressed video bit stream 402 or tracking entropy code words, aligning the zero stuffing bits 406 as described above, and assuming the compressed video bit stream 402 is byte aligned as described above.

MULTI-STANDARD START CODE DETECTOR
SYSTEM 300 OPERATIONAL EXAMPLE

The following is a multi-standard start code detector system 300 operational example which initially assumes that compressed video bit stream 402 is formatted in accordance with any of the MPEG-1, MPEG-2, H.261, or H.263 standards. Also for this example, it is assumed that useful image data 408 equals $XXXX_1XXXX_2$h (the subscripts are used for illustrative purposes only to identify 16-bit groups), zero stuffing bits 406 equal $0000_1 0000_2 00 3_a$h, and next start code 405 includes $00_{3b}01_{4a}XX_{4b}h$ (the subscripts "a" and "b" indicating the first and second bytes, respectively, of a 16-bit group). It will be recognized by one of ordinary skill in the art after reading this description, that multi-standard start code detector system 300 may accommodate other video and nonvideo standards.

Assuming that useful image data 408 is error free or otherwise useful, comparator unit 308 output signals enable [1:0] are initially both set low to a logic zero by control state machine 307 to place comparator unit 308 into an idle state until the detect_start_code flag in register file 324 is set by DSP core 201. As multi-standard start code detector system 300 receives compressed video bit stream 402, 16 bits of useful image data 408 $XXXX_1h$ are loaded into current data buffer 304 and register shifter_result 334, and the next 16 bits of useful image data 408 $XXXX_2h$ are loaded into next data buffer 306. While comparator unit 308 is in the idle state, current data $XXXX_1h$ is appropriately shifted from register shifter_result 334 by shifter 312 into entropy code bit length searching module 314 (described below). When Acc[4:0] is greater than fifteen, next data $XXXX_2h$ is subsequently loaded into current data buffer 304 via gate 326 and into register shifter_result 334. The next 16 bits of compressed video bit stream 402, $0000_1h$, are loaded into next data buffer 306. With comparator unit 308 still idle, current data $XXXX_2h$ in register shifter_result 334 is shifted into entropy code bit length searching module 314, next data $0000_1h$ is loaded into current data buffer 304 and register shifter_result 334. The next 16 bits of compressed video bit stream 402, $0000_2h$, are loaded into next data buffer 306. After the DSP core 201 detects an end of the useful image data 408, DSP core 201 sets the detect_start_code flag to "1", and control state machine 307 sets output signals enable[1:0] to 01b to request comparator unit 308 to compare the contents of register shifter_result 334 with 0001h. Additionally, zero stuffing bits 406 are preferably byte aligned if appropriate as described above. Comparator unit 308 thus being placed into an enabled state begins searching for next start code 405.

Current data in current data buffer 304 and register shifter_result 334 equals $0000_1h$ and next data in next data buffer 306 equals $0000_2h$. Start code feature predetection logic 310 processes the contents of next data buffer 306, $0000_2h$, using OR logic. Because the next data buffer 306 contents are all logic zeros, the output signal not_all_zero remains low at logic "0". Comparator unit 308 compares the current data with 0001h and determines that the current data does not match the predetermined selected feature of next start code 405. Because output signal not_all_zero is low and a match is not detected by comparator unit 308, comparator unit 308 sets output signals skip_size to 10000h and detector_status to "0". Because output signal detector_status is low, output signals enable[1:0] remain at 01b. Shifter 312 responds to output signal skip_size and effectively discards current data $0000_1h$. Control state machine 307 opens gate 326 which transfers the next data $0000_2$ into current data buffer 304 which is shifted by shifter 312 into register shifter_result 334. The next 16 bits of compressed video bit stream 402, $00_{3a}00_{3b}h$ are loaded into next data buffer 306. The multi-standard start code detection operation continues as described above, and in response to a non-match by comparator unit 308 and the start code feature predetection logic 310 output signal not_all_zero equal to "0", $0000_2h$ is effectively discarded from register shifter_result 334. The contents of next data buffer 306, $00_{3a}00_{3b}h$, are loaded into current data buffer 304 and shifted into register shifter_result 334, The $01_{4a}XX_{4b}h$ bits are loaded into next data buffer 306.

Start code feature predetection logic 310 processes the contents of next data buffer 306, detects a "1" bit, and sets output signal not_all_zero to "1". Comparator unit 308 compares the current data, $00_{3a}00_{3b}h$, with 0001h and, upon failing to detect a match, output signal detector_status remains low. Assuming that DSP core 201 has identified compressed video bit stream 402 as being byte aligned and correspondingly notified bitstream processor 234 by appropriately setting the BP_MODE register SF bits (Tables 1 and 2), the contents of next data buffer 306 are either 0001h or 01XXh. Comparator unit 308 thus sets output signal skip_size to 01000b because next data buffer 306 contains at least part of the start code 405. Shifter 312 effectively discards $00_{3a}$, register shifter_result 334 now contains current data of $00_{3b}01_{4a}h$ after shifting $01_{4a}h$ from next data buffer 306. Comparator unit 308 will detect a match between the current data and the start code pattern 0001h and will set output signal detector_status high. Control state machine 307 sets output signals enable[1:0] to 00b thus placing comparator unit 308 into an idle state and notifies DSP core 201 that a next start code 405 has been detected.

Assume now that instead of being byte aligned, DSP core 201 has appropriately notified bitstream processor 234, as described above, that compressed video bit stream 402 is not byte aligned. The start code detection operation of multi-standard start code detector system 300 proceeds as described above until a logic one is detected by start code feature predetection logic 310 in the contents of next data buffer 306 which in this example equals $01_{4a}XX_{4b}h$. Start code feature predetection logic 310 sets output signal not_all_zero high, and comparator unit 308s current data, $00_{3a}00_{3b}h$, for a match with 0001h. A match is not detected, and comparator unit 308 sets output signal skip_size to 00001b because the location of the 0001h bits of next start code 405 are unknown. Shifter 312 and control state machine 307, controlling the contents of register shifter_result 334, effectively discard successive most significant bits in register shifter_result 334 and shift in successive most significant bits of next data buffer 306 on a bit by bit basis. After each of the one bit shifts, comparator unit 308 examines the current data in register shifter_result 334 to detect a match with 0001h until a match is detected. In this example, after performing eight one bit shifts, current data is equal to $00_{3b}01_{4a}h$, and comparator unit 308 detects a match. After detecting a match, operation of compressed video bit stream 402 proceeds as described above.

Assuming now that an error is detected in next start code 405 either by, for example, bitstream processor 234 or DSP core 201, if the err_handle_mode flag in the BP_CONTROL register (Table 3), as described above, bitstream processor 234 begins the next start code 405 search operation by first examining entire 16 bit groups for the most significant zero stuffing bits 406 and then for 0001h of next start code 405. Control state machine 307 sets output signals enable[1:0] to 10b, and comparator unit 308 compares the contents of register shifter_result 334 with 0000h. Until a match is found, comparator unit 308 sets output signal skip size to 10000b. Accordingly, sixteen bit groups of current data in register shifter_result 334 are effectively discarded by shifter 312, and control state machine 307 controls gate 326 to transfer the sixteen bit contents of next data buffer 306 to current data buffer 304 which is shifted to register shifter_result 334. The next sixteen bits of compressed video bit stream 402 are loaded into next data buffer 306. In this example, corrupted image data 408 equal $XXXX_1h$ is compared against 0000h by comparator unit 308 followed by a comparing $XXXX_2$ against 0000h. The third comparison operation compares 0000₁h with 0000h, and a match is detected. Comparator unit 308 sets output signal detector_status to "1", and control state machine 307 sets output signals enable[1:0] to 01b. The start code search operation then proceeds as described above in accordance with byte alignment nature of compressed video bit stream 402.

ENTROPY CODE BIT LENGTH SEARCHING MODULES

Compressed video bit stream 402 is encoded according to various VLC ("VLC") tables or entropy code tables (also referred to as Huffman tables). In one embodiment, the bitstream processor 234 supports all Huffman tables recommended and described in the respective MPEG-1, MPEG-2, H.261, and H.263 video standard documents. Most tables are implemented into the look-up table ("LUT") 332. In one embodiment, LUT 332 is a 768×12 bit read only memory. Some simple or quite complicated Huffinan tables are implemented using hardwired logic. For more information regarding LUT 332 methodology and topology, please refer to Appendix B of co-pending U.S. patent application Ser. No. 08/699,300 of C. Reader, entitled "Methods and Apparatus for Processing Video Data." Entropy coding is generally defined as variable length coding of a signal to reduce redundancy. In general, entropy coding assigns shorter entropy code words to frequent events and longer code words to less frequent events.

A decoding operation involves generating addresses with address generator 338 from parsed entropy code words for LUT 332 to provide a decoded data output signal. The entropy code words of compressed video bit stream 402 are predetermined and packed to form a continuous bit stream. For more information regarding entropy code packing, please refer to co-pending and concurrently filed U.S. patent application Ser. No. 08/731,338 by Jae Cheol Son entitled "System for Variable Length Code Data Stream Position Arrangement," which is herein incorporated by reference in its entirety. To decode compressed video bit stream 402, compressed video bit stream 402 is parsed into individual entropy code words to generate addresses for LUT 432. One approach to parsing compressed video bit stream 402 into successive entropy code words involves using entropy code bit length searching module 314 to determine the bit length of a current entropy code word. Once the bit length is determined, the entropy code word may be identified, parsed from compressed video bit stream 402, and decoded. This decoding operation replaces a conventional separate ROM allocated to entropy code bit lengths and provides a relatively more compact design.

Referring to FIG. 3, during the decoding operation, control state machine 307 places comparator unit 308 in the idle state by setting output signals enable [1:0] to 00b. Shifter 312 feeds entropy code bit length searching module 314 with compressed video bit stream 402 data from register shifter_result 334, and entropy code bit length searching module 314 determines the bit length of the current entropy code. The operations of loading of data from next data buffer 306 to current data buffer 304, shifting the contents from current data buffer 304 to register shifter_result 334, and loading next data buffer 306 with the next sixteen bits of compressed video bit stream 402 are under the control of control state machine 307 and tied to the content of accumulator 336 as previously described. Control state machine 307 selects signal bit_length_code for transfer via multiplexer 328 to shifter 312. The determined bit length information is conveyed to shifter 312 via multiplexer 328, and shifter 312 parses the contents of register shifter_result 334 in accordance with the determined bit length represented by signal bit_length_code. Shifter 312 uses the contents of accumulator 336, Acc[4:0] to keep track of previously parsed data bits in register shifter_result 334. Current data buffer 304 is refilled from next data buffer 306 only after register shifter_result 334 is empty, i.e., contains no unparsed bits.

Figure 5:
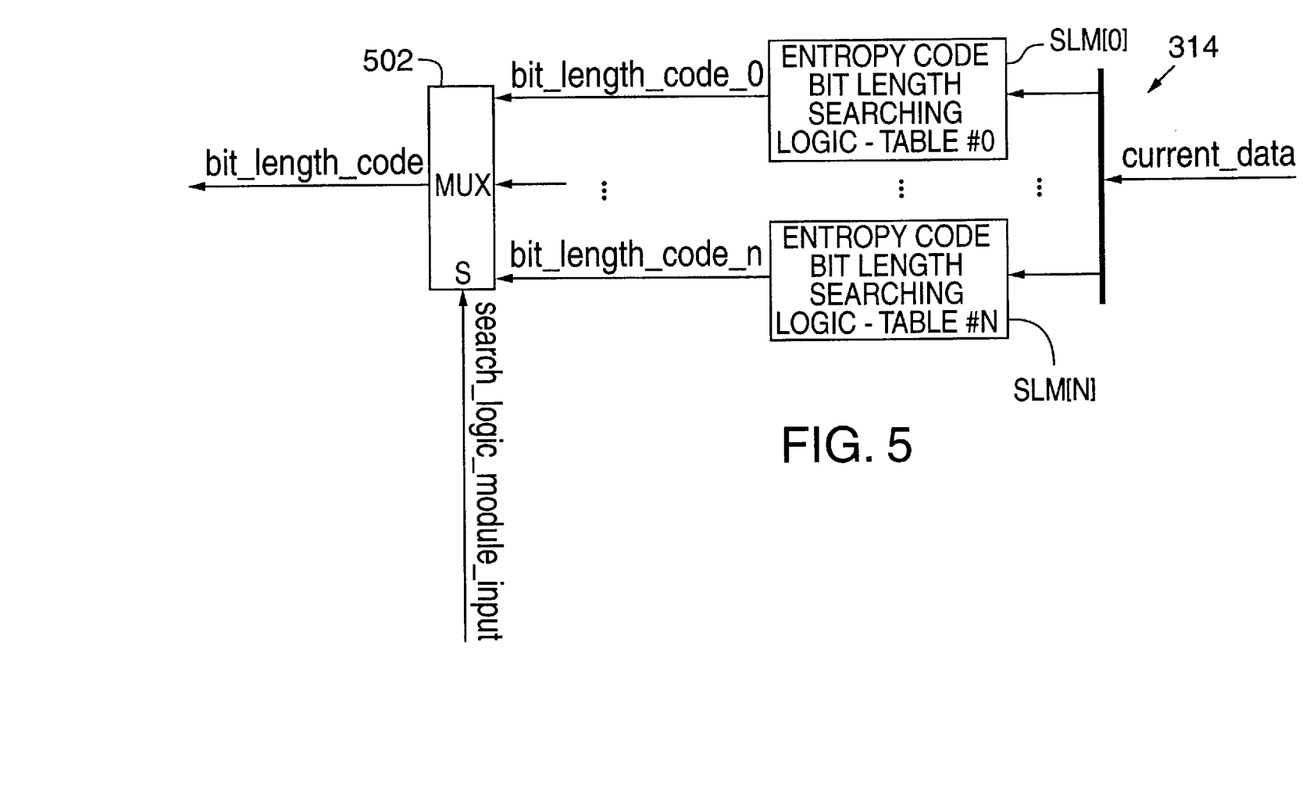
FIG. 5 illustrates entropy code bit length searching logic employed by the bitstream processor of FIG. 3.

Referring to FIG. 5, entropy code bit length searching module 314 is organized into N+1 respective entropy code bit length searching logic SLM[N:0]. Each of the respective entropy code bit length searching logic SLM[N:0] is configured to represent a respective VLC table as predetermined by the formatting standards supported by bitstream processor 234 which in one embodiment are MPEG-1, MPEG-2, H.261, and H.263. Therefore, N+1 equals the number of tables used by the multi-standard formats which in this embodiment is twenty eight. Each of the respective entropy code bit length searching logic SLM[N:0] receives identical sixteen current_data bits from register shifter_result 334 via parallel conduction paths. Control state machine 307 receives the most significant bit of next data buffer 306. In one embodiment, the maximum number of current_data bits stored at any one time in each of the respective entropy code bit length searching logic SLM[N:0] is sixteen bits which equals the maximum entropy code word bit length minus one used by the multi-standard formats. If one of the entropy code bit length searching logic SLM[N:0] detects a seventeen bit length entropy code word, control state machine 307 is notified via signal bit_length_code and may append the least significant (seventeenth) bit to the contents of register shifter_result 334.

Each of the respective entropy code bit length searching logic SLM[N:0] determines the bit length of the most significant entropy code word received if the entropy code word belongs to the table represented by the respective one of the entropy code bit length searching logic SLM[N:0]. Each of the entropy code bit length searching logic SLM[N:0] includes a respective output signal, bit_length_code[N:0], to represent a determined bit length of the most significant entropy code word. Control state machine 307 selects the one of the output signals bit_length_code[N:0] that represents the table associated with the most significant entropy code word to pass through to the output node of multiplexer 502. Control state machine 307 makes this selection by asserting an output signal select_logic_module_input on a select terminal of multiplexer 502.

During the decoding operation, control state machine 307 also selects the output signal bit_length_code to pass through multiplexer 328 to an input terminal of shifter 312. Shifter 312 responds to the input signal bit_length_code by shifting parsed current data from the most significant unused contents of register shifter_result 334. The parsed current data, having a number of bits equal to the input signal bit_length_code, is passed to address generator 338. Address generator 338 generates an address for LUT 332. Subsequently, generally within a few nanoseconds, shifter 312 shifts a number of most significant unused bits from register shifter_result 334 equal to the input signal bit_length_code into entropy code bit length searching module 314. Bits in current data buffer 304 and next data buffer 306 are considered "unused" in this context if they have not been previously transferred to entropy code bit length searching module 314. When register shifter_result 334 is empty, i.e. contains only used bits in both contexts, current data buffer 304 is reloaded via gate 326 with the contents of next data buffer 306. The contents of current data buffer 304 are shifted into register shifter_result 334, and next data buffer 306 is reloaded with the next sixteen bits of compressed video bit stream 402.

Figure 6:
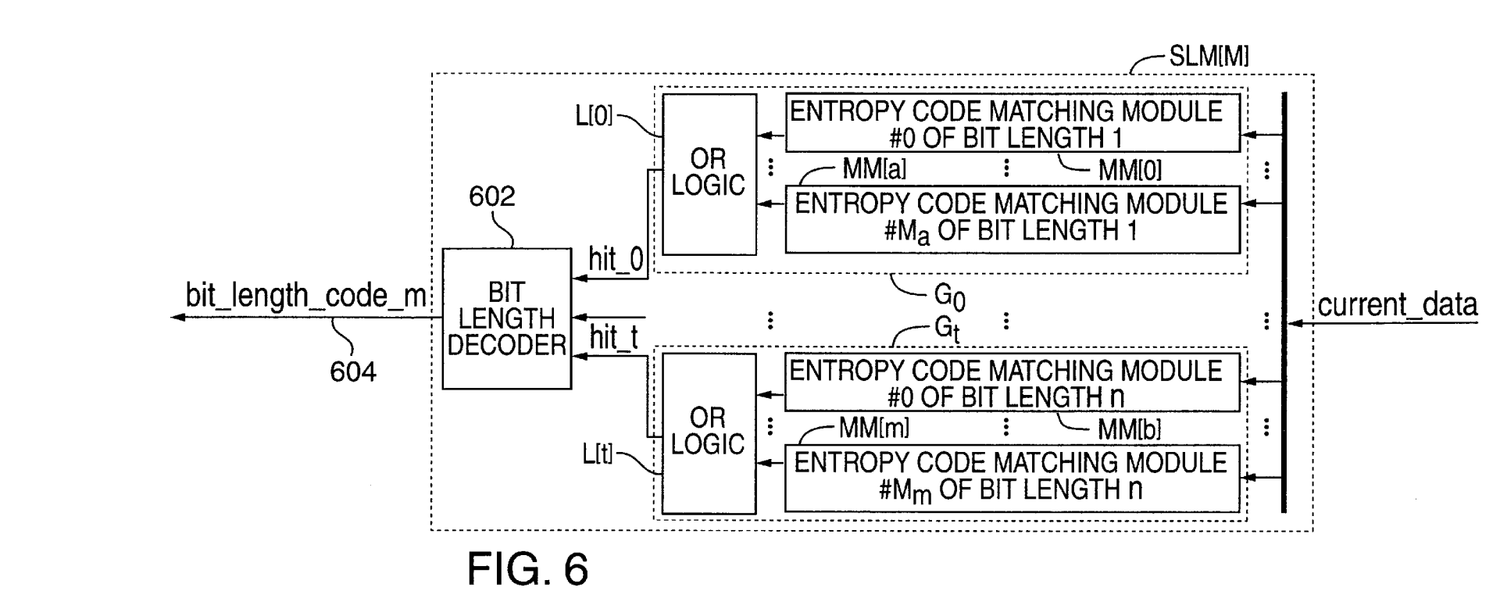
FIG. 6 illustrates entropy code bit length searching logic of FIG. 5 for a single VLC table.

Referring to FIG. 6, entropy code bit length searching logic SLM[M] represents one embodiment of each of the respective entropy code bit length searching logic SLM [N:0]. The overall organization of entropy code bit length searching logic SLM[M] involves arranging entropy code matching modules MM[m:0] (i.e., matching modules MM[M] through MM[0]) into matching module groups G[t:0]. Each of the potential entropy code bit lengths in a VLC table as described by MPEG-1, MPEG-2, H.261, and H.263 is represented by one of groups G[t:0]. Each of the matching modules in a matching module group receives n bits of compressed video bit stream 402 via input signal current_data to detect an entropy code word having a bit length. For example, if entropy code bit length searching logic SLM[M] is associated with the MPEG-1 motion VLC table of Table 4, then matching module group G[0] detects entropy code words having the smallest bit length which for this table is one (code 0). Also, matching module group G[t] detects entropy code words having the largest bit length which for the VLC table of Table 4 is eleven (codes (-16) through (11) and 11 through 16). Each of the entropy code matching modules MM[M:0] matches the most significant n-x bits with a bit pattern corresponding to one or more predetermined entropy code words. The number of matching modules in a matching module group is preferably selected on the basis of a minimal number of bit patterns necessary to accurately detect all predetermined entropy code words having the bit length associated with the particular group without making any false detections or missing a detection. Predetermining the number of matching modules in a group, for example, "a+1" for matching module group G[0] and "m−b+1" for matching module group G[t], and predetermining the number of matching module groups ("t+1") is described in more detail below.

Table 4 specifically represents the entropy codes for motion vectors located in annex B.4 of the MPEG-1 document. The examples below related to Table 4 may be adapted to apply to the entropy code tables of other formatting standards such as the multi-standard formats.

TABLE 4

| Pattern | Matching Module Groups number | Matching Modules number | Motion VLC Code | Code |
| --- | --- | --- | --- | --- |
| 0000 001 | 7 | 1 | 0000 0011 001 | −16 |
| 0000 001 | 7 | 1 | 0000 0011 011 | −15 |
| 0000 001 | 7 | 1 | 0000 0011 101 | −14 |
| 0000 001 | 7 | 1 | 0000 0011 111 | −13 |
| 0000 0100 0 | 7 | 0 | 0000 0100 001 | −12 |
| 0000 0100 0 | 7 | 0 | 0000 0100 011 | −11 |
| 0000 0100 1 | 6 | 1 | 0000 0100 11 | −10 |
| 0000 0101 | 6 | 0 | 0000 0101 01 | −9 |
| 0000 0101 | 6 | 0 | 0000 0101 11 | −8 |
| 0000 011 | 5 | 1 | 0000 0111 | −7 |
| 0000 10 | 5 | 0 | 0000 1001 | −6 |
| 0000 10 | 5 | 0 | 0000 1011 | −5 |
| 0000 11 | 4 | 0 | 0000 111 | −4 |
| 0001 | 3 | 0 | 0001 1 | −3 |
| 001 | 2 | 0 | 0011 | −2 |
| 01 | 1 | 0 | 011 | −1 |
| 1 | 0 | 0 | 1 | 0 |
| 01 | 1 | 0 | 010 | 1 |
| 001 | 2 | 0 | 0010 | 2 |
| 0001 | 3 | 0 | 0001 0 | 3 |
| 0000 11 | 4 | 0 | 0000 110 | 4 |
| 0000 10 | 5 | 0 | 0000 1010 | 5 |

TABLE 4-continued

| Pattern | Matching Module Groups number | Matching Modules number | Motion VLC Code | Code |
| --- | --- | --- | --- | --- |
| 0000 10 | 5 | 0 | 0000 1000 | 6 |
| 0000 011 | 5 | 1 | 0000 0110 | 7 |
| 0000 0101 | 6 | 0 | 0000 0101 10 | 8 |
| 0000 0101 | 6 | 0 | 0000 0101 00 | 9 |
| 0000 0100 1 | 6 | 1 | 0000 0100 10 | 10 |
| 0000 0100 0 | 7 | 0 | 0000 0100 010 | 11 |
| 0000 0100 0 | 7 | 0 | 0000 0100 000 | 12 |
| 0000 001 | 7 | 1 | 0000 0011 110 | 13 |
| 0000 001 | 7 | 1 | 0000 0011 100 | 14 |
| 0000 001 | 7 | 1 | 0000 0011 010 | 15 |
| 0000 001 | 7 | 1 | 0000 0011 000 | 16 |

Each of the entropy code matching modules MM[M:0] generates an output signal which indicates whether or not the most significant n−x bits of a matching module represents entropy code word. The entropy code matching modules MM[M:0] are organized and configured so that only one matching module may produce a logical one output signal during a cycle. When the most significant n−x bits buffered in a matching module represent an entropy code word, this matching module produces a logical one output signal.

Entropy code bit length searching logic SLM[M] is configured so that, preferably, there is at least one matching module included in each of the matching module groups G[t:0]. To determine a minimum number of matching modules for a respective matching module group, the entropy code table represented by entropy code bit length searching logic SLM[M] is examined, and entropy code word table entries are grouped by bit length and according to a common most significant bit pattern that is unique to the entropy code word table entries. For example and referring to Table 4, beginning with the smallest entropy code word(s), determine how many leading zeros the smallest entropy code word(s) has. Assuming that there are X leading zeros, next examine any entropy code words of greater length that have the same number, X, of leading zeros. A pattern is determined by taking Y most significant bits from one of the smallest entropy code words such that a comparison match will not occur with the Y most significant bits of an entropy code word entry having a different bit length than the smallest entropy code words. This process may be repeated for each of the smallest entropy code word(s). The number of different determined patterns equals the number of matching modules in the group of matching modules for the smallest bit length. This process is repeated for each entropy code word entry. It will be understood by those of ordinary skill in the art that unique matching patterns may be determined in a variety of ways.

As an example and referring to Table 4, the entropy code bit length searching logic SLM[M] for the MPEG-1 motion VLC table has eight matching module groups G[7:0]. Matching module groups G[4:0] each have one respective entropy code matching module MM[0], and matching module groups G[7:5] each have two respective entropy code matching modules MM[1:0]. Table 4 also includes a unique pattern associated with each respective matching module. When a pattern of bit length Z is matched against the most significant Z bits of the n bit input into each matching module of entropy code bit length searching logic SLM[M], a match will only be found in one of the matching module groups G[7:0]. As can be seen from Table 4, chip area for implementing entropy code bit length searching module 314 for determining the bit length of an entropy code word is reduced relative to including a LUT ROM to determine bit length.

Figure 7:
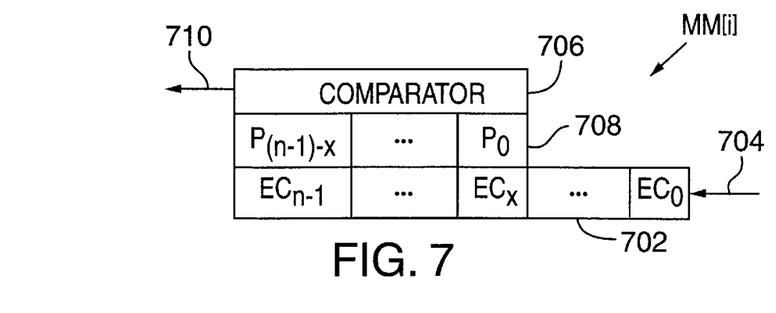
FIG. 7 illustrates one embodiment of an entropy code matching module employed by the entropy code bit length searching logic of FIG. 6.

Referring to FIG. 7, matching module MM[i] respectively represents each of the entropy code matching modules MM[m:0] of matching module groups G[t:0] of FIG. 6. Matching module MM[i] includes entropy code buffer 702 which stores the n current data bits, EC[n−1:0], of compressed video bit stream 402 received via current_data input signal path 704. Most significant bits EC[n−1:x] are compared with n−x pattern bits, P[(n−1)−x:0], where n−x equals the bit length of the pattern associated with the matching module. For example and referring to Table 4, when matching module MM[i] represents matching module MM[1] of matching module group G[6] which detects entropy code words of bit length ten and n equals seventeen, the associated pattern, 0000 0100 1b, is nine bits long. Therefore, x equals eight and n−x equals nine. Thus, EC[n−1:x] equals E[16:8], and P[(n−1)−x:0] equals P[8:0]. If the pattern bit length is one, E[n−1] equals E[x] and P[(n−1)−x] equals p[0]. Comparator 706 compares the most significant entropy code data bits, EC[n−1:x], with the most significant pattern bits P[(n−1)−x:0] on a one to one basis. If a match is detected, matching module MM[i] asserts a logical "1" output signal on output line 710, otherwise, matching module asserts a logical "0".

Comparator 706 may be implemented using any of a variety of well-known circuits or software algorithms such as with exclusive OR logic or exclusive OR algorithms. Pattern bits P[(n−1)−x:0] may be hardwired, or, to increase flexibility and possibly reduce the number of entropy code bit length searching logic modules, pattern bits P[(n−1)−x:0] may be programmed in accordance with the entropy code table associated with the current entropy code word.

A logic module is used to determine if any of the matching modules of matching module groups G[t:0] identified an entropy code word as indicated by a logical "1" output signal from the identifying one of entropy code matching modules MM[m:0]. In the embodiment of FIG. 6, matching module output signals from each of respective matching module groups G[t:0] are applied to respective OR logic modules L[t:0]. The bit length of the current entropy code is determined by which of the OR logic modules L[t:0] has a logical one output signal, hit_t: hit_0, respectively. Bit length encoder 602 receives OR logic modules L[t:0] output signals hit_t: hit_0 from respective conduction paths. Bit length encoder 602 produces a coded output signal, bit_length_code_M, that corresponds to the matching module group having a matching module which produced a logical "1" output signal. For example, if t equals seven for matching module groups G[t:0], then matching module groups G[t:0] represent eight different entropy code bit lengths. Therefore, the output signal bit_length_code has eight possible output signal values to directly represent eight possible entropy code bit lengths. Bitlength_code_M output signal path 604 will correspondingly have four output signal lines to represent the four bits of output signal bit_length_code_M. Because entropy code matching modules MM[m:0] and matching module groups G[t:0] are configured and arranged so that only one of the entropy code matching modules MM[m:0] produces a logical one output signal during a cycle, the bit_length_code_M directly represents the bit length of the current entropy code word buffered in the n−x most significant bits of the matching module producing the logical one output signal.

Referring to FIG. 5, each entropy code bit length searching logic SLM[N:0] applies a respective one of output signals bit_length_code [N:0] to respective input nodes of multiplexer 502. Control state machine 307 output signal select_logic_module_input is asserted on the select terminal of multiplexer 328. The one of the signals bit_length_code [N:0] selected to pass through to multiplexer 328 is the signal produced by the one of the entropy code bit length searching logic SLM[N:0] allocated to the VLC table corresponding to the current entropy code word.

The multiplexer 502 output signal bit_length_code conducted on bit_length_code is applied to an input node of multiplexer 328. During the decoding operation, control state machine 307 selects the bit_length_code output signal for connection to shifter 312. Shifter 312 shifts a number of bits from current data buffer 304 equal to the bit_length_code signal into address generator 338 which generates an address for LUT 332 as described above. These bits are decoded and passed to a general purpose register in register file 324. These bits are now available to DSP core 201 via I/O bus 212.

While the invention has been described with respect to the embodiments and variations set forth above, these embodiments and variations are illustrative and the invention is not to be considered limited in scope to these embodiments and variations. For example, bitstream processor 234 may be adapted to select any matching pattern by, for example, including a programmable bit pattern memory in comparator unit 308. Furthermore, the functionality of entropy code bit length searching module 314 may be implemented using a processor and software. Accordingly, it will be realized that features of other video and nonvideo standards may be accommodated. Accordingly, various other embodiments and modifications and improvements not described herein may be within the spirit and scope of the present invention, as defined by the following claims.

What is claimed is;:

1. An apparatus to detect a current entropy code word in a group of bits, and the current entropy code word having a bit length, wherein a predetermined number of possible bit lengths of the current entropy code word is t+1, the apparatus comprising:

a plurality of matching modules, wherein the matching modules each receive the group of bits and each attempts to determine the bit length of the current entropy code word in the group of bits, and one of the matching modules determines the bit length of the current entropy code word in the group of bits and provides a unique output signal with respect to output signals of the remaining matching modules; and t+1 matching module groups wherein each of the t+1 matching module groups includes a predetermined number of matching modules, and each of the t+1 matching module groups represents one of the t+1 predetermined number of possible bit lengths of the current entropy code word, wherein each of the t+1 matching module groups has an output signal, and the one of the t+1 matching module groups having the matching module having the unique output signal has a unique output signal, with respect to output signals of the remaining t+1 matching module groups, that indicates the bit length of the current entropy code word.

2. The apparatus of claim 1 wherein each matching module comprises:

an n bit buffer having the group of bits;

an (n−1)−x pattern bit buffer having a bit pattern, wherein the bit pattern matches the most significant n−x bits of at least one possible entropy code word of one possible bit length; and a comparator coupled to the n bit buffer and the (n−1)−x pattern bit buffer to compare the most significant n−x bits of the n bit buffer to the n−x bits of the (n−1)−x pattern bit buffer, wherein if a match occurs the matching module provides the unique output signal.

3. The apparatus of claim 2 wherein the bit pattern has a number of bits corresponding to a minimum number of bits uniquely associated with at least one possible entropy code word of one possible bit length.

4. The apparatus of claim 2 wherein the bit patterns are programmable.

5. The apparatus of claim 1 wherein the number of matching modules in each of the t+1 matching module groups equals the minimum number of bit patterns necessary to uniquely identify each of the predetermined entropy code words for the bit length represented by a respective t+1 matching module group.

6. The apparatus of claim 1 further comprising:
an encoder coupled to the output signals of the t+1 matching module groups, wherein the encoder detects the one of the t+1 matching module groups having a unique output signal and provides a unique code representing the bit length of the current entropy code word.

7. The apparatus of claim 1 wherein the t+1 matching module groups are allocated among N+1 entropy code bit length searching modules, wherein each entropy code bit length searching module represents a predetermined table of entropy code words.

8. The apparatus of claim 1 wherein the predetermined number of possible bit lengths of the current entropy code word is characterized by a standard format from a group consisting of MPEG-1, MPEG-2, H.261, or H.263.

9. The apparatus of claim 1 further comprising:
a multimedia signal processor that includes the plurality of matching modules and t+1 matching module groups.

10. The apparatus of claim 1 wherein t equals eight.

11. The apparatus of claim 1 further comprising:
a multiplexer having an input terminal to receive the unique output signal from the matching module which determines the bit length of the current entropy code word;
a shifter coupled to an output terminal of the multiplexer;
an address generator coupled to the shifter;
a look up table, coupled to the address generator, to decode the entropy code word; and
a control state machine coupled to a select terminal of the multiplexer to select the unique output signal, wherein the shifter is capable of shifting the current entropy code word to the address generator, and the address generator is capable of generating an address of the entropy code word in the look up table.

12. A method of detecting a current entropy code word in a group of bits, and the current entropy code word having a bit length, wherein a predetermined number of possible bit lengths of the current entropy code word is t+1, the method comprising the steps of:
receiving the group of bits in t+1 matching module groups, wherein each of the t+1 matching module groups includes a predetermined number of matching modules, each matching module includes a predetermined bit pattern, and each of the t+1 matching module groups represents one of the t+1 predetermined number of possible bit lengths of the current entropy code word;
comparing the respective bit pattern of each matching module to a respective segment of the group of bits, wherein each bit pattern is associated with only one of the possible t+1 bit lengths of the current entropy code;
determining which bit pattern matches the respective segment of the group of bits; and
providing an output signal, responsive to the bit pattern determined to match the respective segment of the group of bits, that identifies the bit length of the current entropy code word.

13. The method of claim 12 further comprising the step of:
storing the group of bits in a memory; and
parsing the current entropy code word from the stored group of bits in accordance with the output signal that identifies the bit length of the current entropy code word.

14. The method of claim 13 further comprising the step of:
utilizing the parsed current entropy code word to decode the entropy code word.

15. The method of claim 14 wherein the step of utilizing comprises the steps of:
generating an address with the an address generator from the parsed entropy code word for a look up table (LUT); and
decoding the entropy code word with information in the LUT using the generated address.

16. The method of claim 13 further comprising the step of:
providing the output signal to an accumulator to keep track of previously parsed bits in the memory.

17. The method of claim 12 further comprising the step of:
receiving the group of bits in N respective entropy code searching logic modules, wherein each of the N entropy code searching logic modules includes the t+1 respective matching module groups, wherein N represents a number of format tables supported by a multimedia signal processor, and t for each respective matching module group of each entropy code searching logic module is determined by the format table represented by the respective entropy code searching logic module.

18. The method of claim 12 further comprising:
programming the bit patterns for each matching module.

19. A method comprising the steps of:
transmitting a group of bits to a plurality of matching modules in t+1 matching module groups, wherein the group of bits includes a current entropy code word, the current entropy code word has a bit length, and each of the t+1 matching module groups represents one of the t+1 predetermined number of possible bit lengths of the current entropy code word;
determining the bit length of the current entropy code word in the group of bits with one of the matching modules; and
providing a unique output signal with respect to output signals of the remaining matching modules from the matching module which determined the bit length of the current entropy code word in the group of bits that indicates the bit length of the current entropy code word.

20. The method of claim 19 further comprising the steps of:
providing the entropy code word from the group of bits to an address generator;
providing an address from the address generator in response to the provided entropy code word; and
decoding the entropy code word in response to the provided address.

21. The method of claim 20 further comprising the step of:
providing the decoded entropy code word to a digital signal processor.

22. The method of claim 20 wherein the step of providing the entropy code word comprises the step of:

shifting a number of bits from a register equal to the bit length of the current entropy code word.

23. The method of claim 19 wherein the step of transmitting a group of bits to a plurality of matching modules comprises the step of:

transmitting n bits to an n bit buffer of each matching module; and wherein the step of determining the bit length of the current entropy code word comprises the step of:

comparing the most significant n–x bits in the n bit buffer of each matching module to respective (n–1)–x pattern bits of each matching module;

providing the unique output signal if a match occurs in the comparing step.

24. The method of claim 23 further comprising the step of:

minimizing the number of bit patterns necessary to accurately determine the bit length of the current entropy code word in the group of bits with one of the matching modules.

25. The method of claim 19 wherein the predetermined number of possible bit lengths of the current entropy code word is characterized by a standard format from a group consisting of MPEG-1, MPEG-2, H.261, or H.263.

26. A multimedia multiprocessor system further comprising:

a host processor;

a bus coupled to the host processor;

system memory coupled to the host processor; and a multimedia signal processor to detect a current entropy code word in a group of bits, and the current entropy code word having a bit length, wherein a predetermined number of possible bit lengths of the current entropy code word is t+1, the multimedia signal processor comprising a bitstream processor, wherein the bitstream processor further comprises:

a plurality of matching modules, wherein the matching modules each receive the group of bits and each attempts to determine the bit length of the current entropy code word in the group of bits, and one of the matching modules determines the bit length of the current entropy code word in the group of bits and provides a unique output signal with respect to output signals of the remaining matching modules; and t+1 matching module groups wherein each of the t+1 matching module groups includes a predetermined number of matching modules, and each of the t+1 matching module groups represents one of the t+1 predetermined number of possible bit lengths of the current entropy code word, wherein each of the t+1 matching module groups has an output signal, and the one of the t+1 matching module groups having the matching module having the unique output signal has a unique output signal, with respect to output signals of the remaining t+1 matching module groups, that indicates the bit length of the current entropy code word.

* * * * *